United States Patent [19]
Schröder

[11] 3,938,142
[45] Feb. 10, 1976

[54] ULTRASONIC TRANSMITTER FOR THE REMOTE CONTROL OF RADIO AND TELEVISION RECEIVERS

[75] Inventor: Wolfgang Schröder, Pforzheim, Germany

[73] Assignee: International Standard Electric Corporation, New York, N.Y.

[22] Filed: May 29, 1974

[21] Appl. No.: 474,455

[30] Foreign Application Priority Data
June 12, 1973 Germany............ 2329740

[52] U.S. Cl. .............................................. 340/388
[51] Int. Cl.² ........................................ G08B 3/00
[58] Field of Search ........ 340/171 R, 171 A, 384 E, 340/388, 148; 178/DIG. 15

[56] References Cited
UNITED STATES PATENTS

| | | | |
|---|---|---|---|
| 3,009,099 | 11/1961 | Muller............................ | 340/384 E |
| 3,103,664 | 9/1963 | Hooper...................... | 178/DIG. 15 |
| 3,180,199 | 4/1965 | Anderson....................... | 340/384 E |
| 3,430,230 | 2/1969 | Jones............................... | 340/384 E |
| 3,440,648 | 4/1969 | Camenzind...................... | 340/388 |
| 3,603,985 | 9/1971 | Goralnick....................... | 340/384 E |
| 3,678,392 | 7/1974 | Houghton ................... | 340/171 UX |
| 3,747,108 | 7/1973 | Ringer ........................... | 340/171 X |
| 3,846,792 | 11/1974 | Haigh............................. | 340/384 E |

Primary Examiner—Harold I. Pitts
Attorney, Agent, or Firm—John T. O'Halloran; Menotti J. Lombardi, Jr.; Peter Van Der Sluys

[57] ABSTRACT

A polarizing D.C. voltage is generated at the capacitance of the ultrasonic transducer and then short-circuited by a parallel-arranged electronic switch controlled by the command signal frequency to be radiated. A direct current stored in an inductance during this short-circuit phase is supplied via a decoupling diode to the electrodes of the ultrasonic transducer upon opening of the switch, and after having been transformed into a voltage. The polarizing D.C. voltage is thus re-generated periodically.

9 Claims, 4 Drawing Figures

ULTRASONIC TRANSMITTER FOR THE REMOTE CONTROL OF RADIO AND TELEVISION RECEIVERS

BACKGROUND OF THE INVENTION

1. Field of the Invention

The present invention relates to an ultrasonic transmitter employing an electrostatic ultrasonic transducer for remotely controlling radio and television receivers.

2. Description of the Prior Art

Ultrasonic remote-control systems for radio and television receivers are often operated by a number of different command or control signal frequencies, such as eight, which are distributed over the available frequency range of the ultrasonic transmission path. At the transmitting end there is used a simple as possible battery-operated and, therefore, current-saving oscillator which is switched on either by mechanical contacts or electronic sensor circuits as described in U.S. Pat. No. 3,869,671 issued Mar. 4, 1975, and tuned to the selected command or control signal frequency. For this relatively low power type of ultrasonic radiation, besides the piezo-electric arrangements, there are chiefly used electrostatic transducers offering the following possibilities:

1. The a.c. voltage is applied directly to the electrodes of the transducer, while double the frequency of the a.c. voltage is transmitted as sound.
2. The a.c. voltage is superimposed upon a d.c. voltage, for polarizing the electric field between the electrodes of the transducer. The radiated sound frequency is in agreement with the a.c. voltage frequency. This mode of operation has a higher efficiency. In more simple types of well-known electrostatic sound transducers, the dielectric between the electrodes consists of a plastics foil. Operation is done with effective a.c. voltages of about 100 V, and with an additional polarization voltage of at least the peak value of this a.c., in cases where the transducer is operated according to (2) above. For this purpose the supplying a.c. voltage is rectified.

The oscillator, too, is often a simple transistorized oscillator stage of the known type whose radio-frequency coil is provided with a corresponding transformer winding for generating the relatively high a.c. voltage. This arrangement, however, has the disadvantage that in the case of a direct coupling of the electrostatic transducer, the self-capacitance thereof which is often very instable, having an influence upon the frequency stability of the oscillator. Increasing the basic capacitance with a view to reducing this influence, in turn, has the disadvantage of a higher battery current consumption. A decoupling output stage used behind the oscillator and comprising a correspondingly wide-banded output transformer for the working frequency range would have the same disadvantage.

SUMMARY OF THE INVENTION

It is the object of the invention to avoid these disadvantages and to provide a non-reactive wide-band supply system for an electrostatic ultrasonic transducer used for remote-control purposes.

This problem is solved by the invention as set forth in claim 1. Further embodiments of the invention may be taken from the subclaims.

Accordingly, the solution is based on the idea of generating a polarizing d.c. voltage at the capacitance of the ultrasonic transducer and to effect a periodic short-circuiting of the d.c. voltage with the aid of a controlled electronic switch arranged in parallel therewith, with the switch being controlled by the command or control signal frequency to be radiated. Simultaneously, during the short-circuit phase, the current is stored e.g. in an inductance, and is applied, upon opening the switch, as a voltage transformed via the decoupling diode, to the electrodes of the ultrasonic transducer, thus newly producing the polarizing d.c. voltage periodically.

The invention, in particular, offers the advantages that the ultrasonic transducers can be supplied in a non-reactive manner, and that an optimum a.c. voltage and polarization voltage is achievable from any arbitrary battery voltage with a high efficiency. Moreover, the circuit is very simple.

Examples of embodiment of the invention are shown in the drawings and will now be described in greater detail hereinafter.

DESCRIPTION OF THE PREFERRED EMBODIMENT

Figure 1:
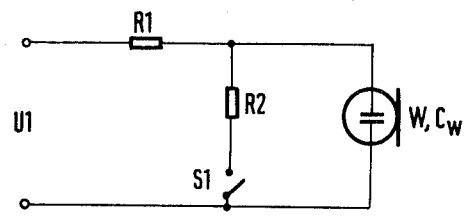
FIG. 1 shows a simple type of circuit relating to an ultrasonic transmitter according to the invention employing a controlled electronic switch arranged in parallel therewith.

In the example of embodiment according to FIG. 1 the polarization voltage U1 at the transducer E is periodically short-circuited in the rhythm of the sound frequency to be radiated, by a parallel-arranged controlled electronic switch S1. The transmission frequency range of the electrostatic transducers used for remote-control purposes is always smaller than one octave, so that no harmonics are transmitted. Apart from this, there is simultaneously effected a polarization with the d.c. voltage U1, so that there is only reproduced the basic frequency as fed in.

In the course of this it is necessary, under certain circumstances, to take into consideration time constants which are due to physical conditions, and which are formed e.g. by internal resistances and transducer capacitances, indicated by the reference numerals R1 and R2 in FIG. 1. R1 and R2, however, may also be inserted directly as protective resistors for avoiding overloads or noise radiations (e.g. electrically radiated harmonics).

The d.c. voltage U1 can be generated in various of the well-known ways, so that a detailed description thereof may be omitted herein. D.c. voltage transducers which may also operate piezoelectrically, serve to increase the battery voltage to the required value.

The switch S1 may be a vacuum tube, a gas-filled tube, a transistor, thyristor, or any other controlled electric switch.

Figure 2:
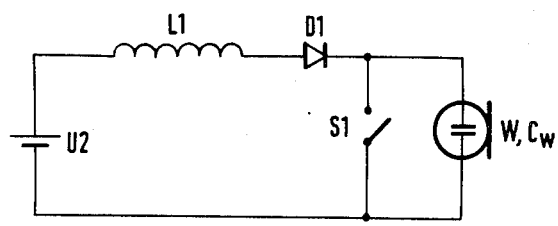
FIG. 2 shows the circuit according to FIG. 1 modified in such a way that a coil of certain dimensions as well as a diode have been added.

FIG. 2 shows a very advantageous type of circuit arrangement for the ultrasonic transmitter according to the invention. Upon closing the switch S1 there will flow from the battery U2, via the coil L1 and the diode D1, a time-linear current I rising in accordance with the law $$I = \frac{U_2 \cdot t}{L_1}$$

wherein $t$ indicates the period of current flow while the switch S1 is closed. Upon opening the switch, the voltage at the transducer capacitance $C_W$ increases to the value $$U_{max} = \frac{U_2 \cdot t}{\sqrt{L_1 C_w}}$$

and drops off to zero upon closing of the switch. When equal periods of time are provided for both the closing and the opening, and when the actuating frequency is $f = 1/2\, t$, the following will apply:

$$U_{max} = \frac{U_2}{2f \sqrt{L_1 C_w}}$$

At the transducer there will appear a square wave voltage lying between zero and $U_{max}$, thus simultaneously containing the polarization voltage of the highest efficiency. During the locking phase, the diode D1 serves as the decoupling element.

The thus produced frequency response of the output available at the transducer may be used for compensating the frequency response of the transducer, with the radiated power thereof increasing as the frequency increases.

It should still be mentioned, that the d.c. voltage transducer may also be a piezoelectric arrangement.

Figure 3:
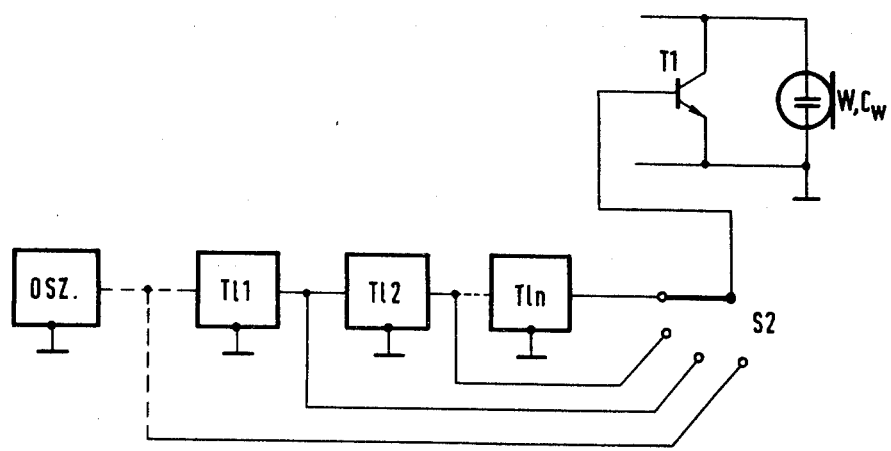
FIG. 3 shows an example of embodiment using a transistor or thyristor as electronic switch, as well as a divider circuit.

FIG. 3 shows an example in which, as already mentioned hereinbefore, the electronic switch may be a transistor or a thyristor. According to FIG. 3 this transistor T1 or thyristor may be controlled with the aid of an a.c. voltage generator OSZ, whose frequency is capable of being influenced either capacitively, inductively, resistively, or by way of voltage variations either continuously or in steps. It may also be a crystal-controlled oscillator whose type of construction is known per se and, therefore, does not need to be shown or explained herein. It may also supply a subsequently arranged divider circuit T1 1, T1 2, . . . T1 n, at the outputs of which the differently divided frequencies may be switched optionally via the electronic or mechanical switch arrangement S2, to the control input of either the transistor T1 or thyristor.

Figure 4:
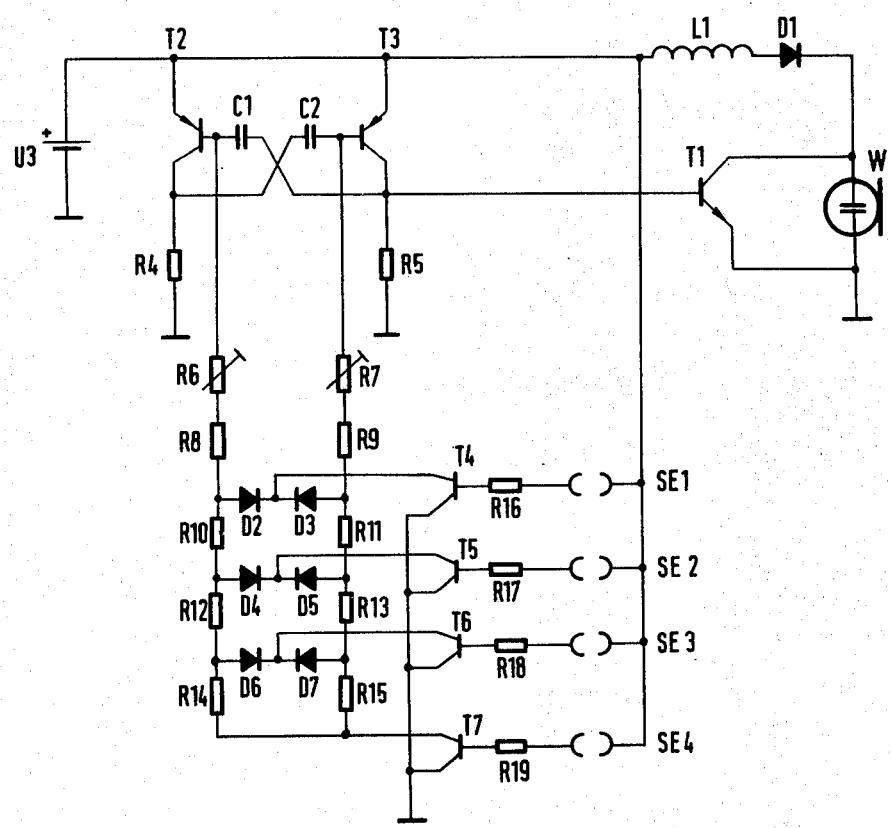
FIG. 4 shows an example of embodiment in which the ultrasonic transmitter is capable of being switched with the aid of sensor (finger-touch) electrodes.

FIG. 4 shows an example of an embodiment in which the ultrasonic transmitter is capable of being switched with the aid of sensor (finger-touch) electrodes. In this case the transistor or thyristor T1 as arranged in parallel with the sound transducer W, is supplied by a symmetrical bistable multivibrator. No sooner than after one of the sensor electrodes SE 1 to SE 4 is bridged by the main conductance of a finger, a base current will flow from the plus pole of the battery U3 via the respective sensor electrode and one of the associated decoupling resistors R16 to R19, as well as via one of the associated transistors T4 to T7, thus causing the respective transistor to be rendered conductive with respect to one of the decoupling diode pairs D2/D3, D4/D5 or D6/D7. The associated pair of diodes permits base current to flow across the base resistance chains R6 to R14 and R7 to R15 in accordance with the respective branching, while the bistable multivibrator with its two PNP-type transistors T2 and T3 is caused to vibrate via the coupling capacitors C1 and C2. Of the two load resistors R4 and R5 only the latter is connected to the control electrode of T1. As soon as a periodic, positively directed voltage occurs across R5, T1 is also switched on periodically thus causing the ultrasonic transmitter to operate. All of the stages are rendered currentless as soon as the finger is removed. R6 and R7 serve to effect the initial frequency tuning of the multivibrator. Of course, the circuit may also be realized with the aid of complementary transistors.

It is still to be noted that all of the aforementioned examples of embodiment are particularly suitable for forming parts of monolithic integrated circuits. For effecting the switching on, the switching over and/or the switching off of the ultrasonic transmitter or its command or control signal frequencies respectively, it is particularly suitable, in accordance with the further pursuance of the invention, to employ arrangements according to U.S. Pat. No. 3,867,671 issued Mar. 4, 1975.

What is claimed is:

1. An ultrasonic frequency transmitter for remote control devices, comprising:
   an electrostatic transducer;
   a source of d.c. voltage connected in parallel with the electrostatic transducer;
   a controllable electronic switch connected across said electrostatic transducer for periodically shorting said transducer; and
   an a.c. voltage generator connected to said electronic switch for controlling said switch so that said transducer transmits a desired ultrasonic frequency.

2. An ultrasonic transmitter as described in claim 1, wherein the frequency of the a.c. voltage generator may be varied.

3. An ultrasonic transmitter as described in claim 1, wherein the a.c. voltage generator comprises an oscillator and at least one frequency divider for providing a plurality of a.c. frequencies for controlling the electronic switch.

4. An ultrasonic transmitter as described in claim 3, additionally comprising switch means for selectively connecting the a.c. frequencies from the oscillator and frequency divider to the electronic switch.

5. An ultrasonic transmitter as described in claim 4, wherein the switch means is an electronic switch.

6. An ultrasonic transmitter as described in claim 1, wherein the a.c. voltage generator comprises a bistable multivibrator having an output for controlling the controllable electronic switch.

7. An ultrasonic transmitter as described in claim 6, wherein the frequency of the multivibrator is variable.

8. An ultrasonic transmitter as described in claim 6, additionally comprising a plurality of frequency controlling elements and switch means for connecting selected ones of said frequency controlling elements to said multivibrator for controlling the frequency thereof.

9. An ultrasonic transmitter as described in claim 8, wherein the switch means comprises finger touch electrodes.

* * * * *